United States Patent [19]
Littke et al.

[11] Patent Number: 4,960,572
[45] Date of Patent: Oct. 2, 1990

[54] METHOD AND APPARATUS FOR CRYSTALLIZING SUBSTANCES DISSOLVED IN A LIQUID AT ZERO-GRAVITY

[75] Inventors: Walter Littke, Schallstadt; Erhard Schoen, Vagen, both of Fed. Rep. of Germany

[73] Assignee: Messerschmitt-Bölkow-Blohm GmbH, Munich, Fed. Rep. of Germany

[21] Appl. No.: 248,234

[22] Filed: Sep. 19, 1988

Related U.S. Application Data

[63] Continuation of Ser. No. 47,878, May 6, 1987, abandoned.

[30] Foreign Application Priority Data

May 7, 1986 [DE] Fed. Rep. of Germany ....... 3615541

[51] Int. Cl.⁵ ................................................. C30B 7/08
[52] U.S. Cl. .............................. 422/245; 156/DIG. 62
[58] Field of Search ............... 422/245; 156/DIG. 62; 362/363; 220/437

[56] References Cited

U.S. PATENT DOCUMENTS

| | | | |
|---|---|---|---|
| 1,095,208 | 5/1914 | Humphrey | 362/363 |
| 1,736,437 | 11/1929 | Gatchell | 362/363 |
| 1,746,340 | 2/1930 | Doane | 362/363 |
| 1,854,020 | 4/1932 | Crocker | 240/52 R |
| 3,425,584 | 2/1969 | Kirkpatrick | 220/437 |
| 3,713,560 | 1/1973 | Slysh et al. | 220/437 |
| 4,408,740 | 10/1983 | Kleber | 156/DIG. 62 |

FOREIGN PATENT DOCUMENTS 70760 1/1983 European .................. 422/245

Primary Examiner—Olik Chaudhuri
Assistant Examiner—Robert M. Kunemund
Attorney, Agent, or Firm—Kenyon & Kenyon

[57] ABSTRACT

A method for crystallizing substances, which are dissolved in a liquid at zero-gravity. In order to limit the extent of lattice defects occuring in the crystallized monocrystals as much as possible, it is provided, that the liquid during the crystallization is held as a quasi freely suspended liquid sphere and the substance in the liquid is crystallized using methods known per se. The liquid sphere is expediently held suspended within a space, which is limited from the outside by retaining elements. In a corresponding device, the retaining elements can be placed on the interior walls of a container.

10 Claims, 1 Drawing Sheet

METHOD AND APPARATUS FOR CRYSTALLIZING SUBSTANCES DISSOLVED IN A LIQUID AT ZERO-GRAVITY

This application is a continuation of application Ser. No. 047,878, filed May 6, 1987, now abandoned.

The present invention relates to a method for crystallizing substances dissolved in a liquid which is at zero-gravity as well as an apparatus for carrying out the method.

In inorganic and organic chemistry as well as in material research and science, substances in the form of extremely pure monocrystals are frequently required, in particular, for the purpose of investigating structures using X-ray diffraction or for the determination of other properties of the pure crystalline substances. It has already been shown, that the production of such monocrystals by crystallizing the particular substances from a liquid which initially holds this substance in solution, leads to poorer results under terrestrial gravity conditions than in space under conditions of weightlessness. For that reason, in space, in particular in the Spacelab, crystallization experiments have already been carried out, with the liquid containing the substance to be crystallized being in a state of zero-gravity or subject to conditions of microgravitation. In these experimental investigations the liquid was contained in a container, which during the crystallization process was closed. In principle, crystallization methods can be used under these conditions, which already have been tested and tried under terrestrial conditions, for example, variations of temperature, changes of concentration ratios within the liquid, etc. It has been shown in the crystallization experiments already carried out in a state of weightlessness that here, too, in spite of marked improvements compared to monocrystals crystallized under terrestrial conditions structural faults still occur to a certain extent.

SUMMARY OF THE INVENTION

It is an object of the present invention to provide a procedure as well as a device of the above mentioned kind, whereby the extent of lattice defects can be reduced as much as possible.

The above and other objects of the invention are achieved by a method for crystallizing substances, which are dissolved in a liquid at zero-gravity, comprising holding the liquid as a quasi freely suspended liquid sphere during the crystallization process and crystallizing the substance in the liquid.

The improvements with respect to lattice defect density achieved with the method according to the invention can be interpreted as meaning that the quasi freely suspended liquid sphere no longer has any wall contact to a large extent as this is the case in customary procedures. This wall contact over a large area presumably leads to crystals frequently crystallizing on it, since the wall favors formation of seed crystals. Practically from the very outset, the irregular wall surface forces lattice defects onto the developing crystal, which form in the interior only slowly or not at all. This could, initially be obviated by the use of crystallization containers, which, all the way down to the atomic level, show smooth inner walls. The production of containers of this nature is, however, to this day technically not possible.

The invention offers an answer to this set of problems, namely, to do altogether without wall contact of the liquid and to leave it quasi freely suspended in zero-gravity space. The term "quasi" here means, that, of course, in suitable ways care is taken that the liquid sphere is kept within a predeterminable space. This, most expediently, is done with retaining elements arranged with a distance between them, limiting this space.

An apparatus for carrying out the method according to the invention, which has a container holding the liquid, is distinguished by the fact that retaining elements are provided, applied at the inner walls of the container, which limit the space for holding the suspended liquid sphere from the outside, with the distances between two retaining elements adjacent to each other being smaller at the edges of the space than the diameter of the liquid sphere.

An apparatus characterized by the presence of such retaining elements, can, by the way, be used generally for holding a suspended liquid sphere in a state of zero-gravity within a given space. The immediate purpose of such an apparatus does not only need to be the crystallization of substances dissolved within the liquid sphere, but in such a liquid sphere other physical- chemical or purely chemical processes can proceed or be carried out.

A device of this nature can be used generally where processes or reactions taking place in a liquid at zero-gravity are intended to be investigated, which are to remain without any external influence as they might occur through wall contact over large areas. Such contact with walls can, for example, lead to the introduction of impurities into the liquid or influence chemical reactions in the wall region in an undesirable way.

The retaining elements can be formed in such a way, that they limit the space, in which the suspended liquid sphere is intended to be held, quasi punctiform or quasi linearly. In the former case, the retaining elements can be pins directed radially toward the center of the space. In the latter case, retaining elements to consider for possible use are, for example, seen from the interior of the space, concavely curved ledges or plates with concave edges. In addition, in the latter case, wires or threads arranged grid- or net-like can be used as retaining elements, with these possibly being formed, for example, basket-like or as spherical quasi-closed containments. It is particularly advantageous, if the retaining elements at least on the sides facing the space are made of a material, which is not wettable at all or only to a slight degree by the liquid.

BRIEF DESCRIPTION OF THE DRAWINGS

The invention will be explained in greater detail in the following detailed description with reference to the drawings in which.

DETAILED DESCRIPTION

Figure 1:
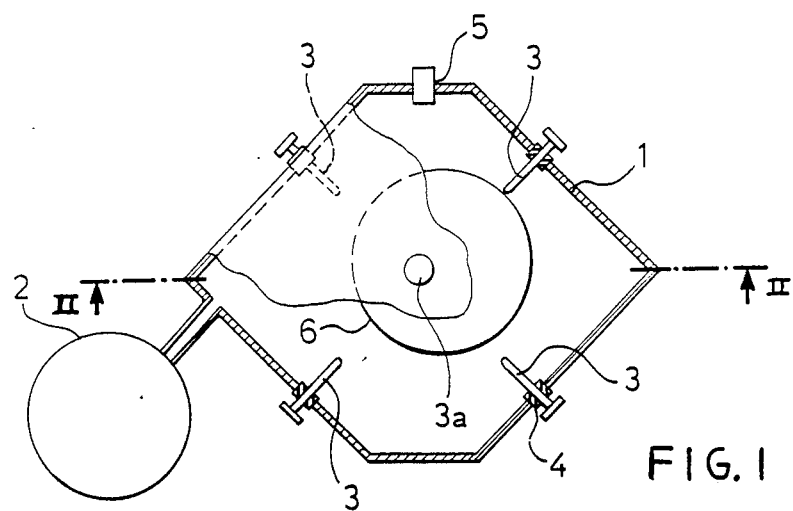
FIG. 1 is a cross sectional view of the apparatus according to the present invention.
Figure 2:
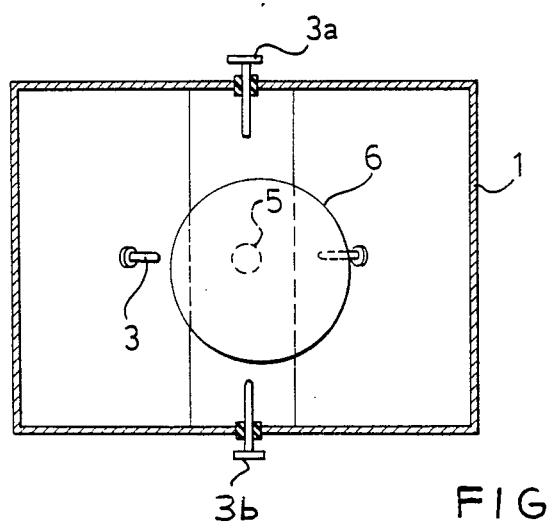
FIG. 2 is a cross sectional view along lines II—II of FIG. 1.

With reference now to the drawings, the two figures show schematically a device for carrying out the procedure according to the invention, in particular, a container 1 in two cross sections arranged perpendicularly to each other, to which a vacuum pump 2 is connected. On the walls of the container 1 are retaining elements in the form of pins 3, and, in particular, these pins 3 are adjustable, for example, slidable or screwable, brought through sealings 4. The container 1 in FIG. 1 is represented in a view from above in a partial cross section lying in the plane of four pins 3. There are six pins 3 altogether, of which two are arranged perpendicularly to the drawing plane FIG. 1 with one (3a) projecting from above the drawing plane into the container 1. The overall arrangement of the pins 3 is that of an octohedron, i.e. the pin ends are arranged at the corners of a double pyramid with square base. The sixth pin 3b is placed opposite to pin 3a at the lower part of the container 1, see FIG. 2.

Of course, other configurations of the pins are conceivable, the simplest, for example, being a tetrahedron of four pins, or, should there be specific requirements, a polyhedron.

In the container, which should be at zero-gravity, a crystallization experiment is intended to be carried out. To this end, before the experiment, through a special, closable opening 5, possibly with a syringe or a pipette, a liquid is continuously introduced into the container, which, because of the existing zero-gravity, solely on the basis of its surface tension forms into a liquid sphere 6. This liquid is a solvent for the substance to be crystallized, the concentration of which in the liquid is initially still below saturation point. The liquid sphere 6 is brought into the space between the inner ends of the pins 3 and its final size dimensioned such, that its diameter is greater than the distance of the inner ends of two adjacent pins 3. Variables for this dimensioning, thus, are the volumn of the liquid introduced into the container 1 as well as the adjustable length of that portion of the pins 3, which projects into the container 1. The liquid sphere 6 will always almost perfectly retain its spherical shape because of the zero-gravity.

If the liquid is introduced into the space between the pin ends with great care and skill, then overall no pulse is imparted so that the liquid sphere 6 is suspended motionless between the pin ends. Should the liquid sphere 6, nevertheless, move, it is prevented by the pins, serving as retaining elements 3, from coming into contact with the container wall. By pushing against the end of one of the pins 3, perhaps even two or maximally three pin ends, the surface of the liquid sphere 6 will be slightly indented at those sites. Because of the quasi elastic effect of the surface tension and the very slight relative speed of the liquid sphere 6, the sphere 6 is going to be repulsed again by the pin ends and will subsequently be suspended again motionless in the space between the pin ends. The processes taking place in the interior of the liquid sphere 6 can thus proceed undisturbed by external influences as they would occur by contact with the wall over a large area.

If the liquid sphere 6 contains a substance to be crystallized, the concentration of which lies just below the saturation point, the crystallization process can be initiated by holding the vapor pressure, which builds up in the interior of the container outside of the liquid sphere 6, continuously below the equilibrium value with the aid of a vacuum pump 2. This results in a lowering of the solvent concentration within the liquid sphere 6 with a concomitant increase of the concentration of the substance to be crystallized until finally saturation is exceeded. And thus the crystallization can begin. Under these conditions, monocrystals with extremely few lattice defects are created.

The pins 3, or at least their inner ends, are appropriately made of a material, which is not at all or only to a slight extent wettable by the liquid which forms the main component of the liquid sphere 6. If water is used as a liquid solvent, then the pins can be made, for example, of teflon. The liquid or solvent should have as high a surface tension as possible.

With the procedure according to the invention, biochemically important compounds, such as proteins, nucleic acids, etc. can be crystallized. Investigations were carried out with highly purified enzymes, like low-molecular lysozyme and high-molecular-galactosidase. The procedure is by no means limited to these, but, on the contrary, is universally applicable, i.e. can also be used for crystallizing other organic as well as inorganic substances from suitable solvents.

The slow concentration of the substance to be crystallized in the liquid sphere can also take place by methods other than the low pressure process (vacuum pump 2).

For example, the container holding the liquid sphere can be connected to an additional container, which contains solvent absorbing compounds. If in the crystallization, water is used as solvent, the absorption compounds $CaCl_2$, $P_4O_{10}$, $Mg(ClO_4)_2$, etc. can be utilized. For organic solvents, surface active substances can be employed.

It is, moreover, possible, to displace the substance to be crystallized from its solvent phase by a second substance. The displacement in this method takes place over the vapor phase. If the substance to be crystallized is, for example, water soluble, but hardly soluble in acetone, the latter can be brought in its liquid phase into the container. For fixating this liquid phase outside the space intended for the liquid sphere, a net-like partitioning wall can be provided. A vapor phase containing water and acetone vapor will form. Acetone will be taken up primarily by the liquid sphere consisting of water, water vapor by the liquid acetone. Thus, in the liquid sphere an increasing water depletion, combined with simultaneously increasing acetone concentration takes place. The substance to be crystallized is gradually displaced from the solution.

A hydrophobic substance can be dissolved in an hydrophobic solvent, for example, hydrocarbons. The liquid sphere would then consist of it. If, on the other hand, a hydrophilic liquid, for example, methanol, is introduced in the liquid phase into the container, then an exchange of hydrocarbon and methanol takes place over the vapor phase in such a way, that the liquid sphere's concentration of methanol increases and its hydrocarbon is being depleted, while the liquid methanol phase takes up hydrocarbon. The increase of the methanol concentration in the liquid sphere finally leads to the crystallization of the substances dissolved in the hydrocarbon.

It is furthermore possible, to displace proteins from aqueous solutions through careful "salting out". In this method, the aqueous protein solution forming the liquid sphere is saturated too close to the displacement point with salt, for example, ammonium sulfate. In addition, an aqueous ammonium sulfate solution is brought into the container, the salt concentration of which is higher than that of the liquid sphere. Gradually equilibrium is reached over the vapor phase, which leads to the dilution of the aqueous ammonium sulfate solution and to a concentration of the ammonium sulfate in the aqueous protein solution of the liquid sphere. In this way, the displacement point of the protein is exceeded and the latter begins to crystallize.

Furthermore, in general, any substance can be displaced in crystalline form from a solution through temperature variations.

The procedure according to the invention is primarily suited for use in space, for example, in the Spacelab, where conditions of zero-gravity or microgravity prevail. The suspended liquid sphere can exist only under these conditions. On being transported back to earth, accelerations, in addition, occur, which bring with it the danger of destruction of the formed crystals. It is therefore advisable, during the state of zero-gravity, after the crystals are formed, to flood the entire container with a suitable liquid in which the crystals can float. This prevents during acceleration the breaking up of the liquid at the ends of the retaining elements and the breaking of the crystals at the container walls. The liquid used for flooding should have approximately the same density as the crystals, should not be a solvent for the latter, should not be able to react chemically with the crystals and should completely mix with the liquid of the liquid sphere. The latter, however, is not absolutely imperative. In the case of protein crystals, flooding can, for example, be done with ammonium sulfate solution, the concentration of which is slightly above the concentration of the ammonium sulfate in the liquid sphere. The liquid which now fills the container completely, acts as an absorber during acceleration shocks on the motion of the crystals. In this way, it is possible to transport the latter largely undamaged to earth.

In the foregoing specification, the invention has been described with reference to a specific exemplary embodiment thereof. It will, however, be evident that various modifications and changes may be made thereunto without departing from the broader spirit and scope of the invention as set forth in the appended claims. The specification and drawings are, accordingly, to be regarded in an illustrative rather than in a restrictive sense.

What is claimed is:

1. An apparatus for cyrstallizing a substance which is dissolved in a liquid, the apparatus functioning in zero-gravity and comprising:

container means enclosing a three-dimensional space of preset dimensions within which space the liquid forms a quasi-freely suspended liquid sphere having a diameter; and retaining means at least one of disposed on inner walls of the container means and inserted through the walls of the container means into the three-dimensional space, the retaining means limiting the space for holding the suspended liquid sphere from outside the space in a quasi-freely suspended state by momentary and intermittent contact with the sphere, whereby the sphere is held non-rigidly within the space by the retaining means, the retaining means being at least one of quasi-punctiform and quasi-linear, the retaining means thereby preventing the sphere from contacting the inner walls of the container means, the maximum distance between innermost parts of any two adjacent retaining means being smaller than the diameter of the liquid sphere.

2. The apparatus recited in claim 1, wherein the retaining means are quasi-punctiform and comprise pins directed radially toward the center of the space.

3. The apparatus recited in claim 1, wherein said retaining means comprise quasi-linear surface means.

4. The apparatus recited in claim 3, wherein said retaining means comprise at least one of ledges curved concavely, plates with concave edges when seen from the interior of the space, grid-like structures curved concavely when seen from the interior of the space and net-like structures curved concavely when seen from the interior of the space.

5. The apparatus recited in claim 1, wherein at least portions of the retaining means facing into the space are made of a material which can only be wetted minimally or not at all by the liquid.

6. Apparatus for holding a liquid sphere having a diameter at zero-gravity within an enclosed defined space comprising support means and retaining means disposed on the support means for preventing the sphere from moving outside the enclosed defined space, said retaining means limiting the enclosed defined space from outside the space whereby the sphere is held non-rigidly within the space in a quasi-freely suspended state by momentary and intermittent contact with the retaining means, the retaining means being at least one of quasi-punctiform and quasi-linear and being disposed in spaced relationship to each other, the maximum distance between innermost parts of any two adjacent retaining means being smaller than the diameter of the liquid sphere.

7. The apparatus recited in claim 6, wherein the retaining means are quasi-punctiform and comprise pins directed radially toward the center of the space.

8. The apparatus recited in claim 6, wherein said retaining means comprise quasi-linear surface means.

9. The apparatus recited in claim 8, wherein said retaining means comprise at least one of ledges curved concavely, plates with concave edges when seen from the interior of the space, grid-like structures curved concavely when seen from the interior of the space and net-like structures curved concavely when seen from the interior of the space.

10. The apparatus recited in claim 6, wherein at least portions of the retaining means facing into the space are made of a material which can only be wetted minimally or not at all by the liquid.

* * * * *